(12) United States Patent
Imafuku et al.

(10) Patent No.: US 8,196,295 B2
(45) Date of Patent: Jun. 12, 2012

(54) COMPONENT MOUNTING METHOD

(75) Inventors: Shigeki Imafuku, Minamiarupusu (JP); Takeyuki Kawase, Tosu (JP); Yoichi Tanaka, Ogori (JP); Osamu Okuda, Chikushino (JP); Takanori Yoshitake, Tosu (JP); Toshiyuki Kino, Tosu (JP)

(73) Assignee: Panasonic Corporation, Osaka (JP)

( * ) Notice: Subject to any disclaimer, the term of this patent is extended or adjusted under 35 U.S.C. 154(b) by 1000 days.

(21) Appl. No.: 11/752,631

(22) Filed: May 23, 2007

(65) Prior Publication Data

US 2007/0214629 A1 Sep. 20, 2007

Related U.S. Application Data

(62) Division of application No. 10/553,588, filed as application No. PCT/JP2004/005194 on Apr. 12, 2004, now Pat. No. 7,337,533.

(30) Foreign Application Priority Data

Apr. 22, 2003 (JP) ................ P2003-116868
Aug. 27, 2003 (JP) ................ P2003-303065

(51) Int. Cl.
*H05K 3/30* (2006.01)
(52) U.S. Cl. .......................... 29/834; 29/709
(58) Field of Classification Search ............ 29/832–834, 29/709, 720, 740
See application file for complete search history.

(56) References Cited

U.S. PATENT DOCUMENTS

| | | | |
|---|---|---|---|
| 5,172,468 A * | 12/1992 | Tanaka et al. | 29/833 |
| 5,379,514 A * | 1/1995 | Okuda et al. | 29/833 |
| 5,566,447 A | 10/1996 | Sakurai | |
| 5,839,186 A | 11/1998 | Onodera | |
| 5,864,944 A | 2/1999 | Kashiwagi et al. | |
| 6,036,425 A | 3/2000 | Seto | |
| 6,408,505 B1 | 6/2002 | Hata et al. | |
| 6,441,386 B2 | 8/2002 | Sakaguchi | |
| 7,003,872 B2 | 2/2006 | Mimura et al. | |
| 2002/0184755 A1 | 12/2002 | Suhara | |

FOREIGN PATENT DOCUMENTS

| | | |
|---|---|---|
| JP | 02059231 A | 2/1990 |
| JP | 05235598 A | 9/1993 |
| JP | 9214182 | 8/1997 |

(Continued)

OTHER PUBLICATIONS

Japanese Office Action dated Aug. 1, 2007.
Supplementary European Search Report.

*Primary Examiner* — Donghai D. Nguyen
(74) *Attorney, Agent, or Firm* — Pearne & Gordon LLP

(57) ABSTRACT

There is provided a control means for controlling movement positions and movement timings of a nozzle elevating means and a nozzle moving means. The control means stores positions and heights of obstacles located between a component supply unit and a circuit board in advance. The control means moves down a nozzle in sync with the time when the nozzle has finished passing over each obstacle after an electronic component has been photographed by a component camera. Alternatively, the control means moves the nozzle in a path to avoid the obstacles. In addition, in a component mounting region, the nozzle moves at a component mounting region movement height and the component is mounted by the nozzle moved down from the component mounting region movement height. Accordingly, it is possible to shorten an elevating stroke of the nozzle (5). In addition, the nozzle can be elevated in an arc trajectory.

3 Claims, 13 Drawing Sheets

FOREIGN PATENT DOCUMENTS

| | | |
|---|---|---|
| JP | 10-113826 | 5/1998 |
| JP | 11261297 | 9/1999 |
| JP | 11330786 | 11/1999 |
| JP | 2001-284898 | 10/2001 |
| JP | 2002111284 | 4/2002 |
| KR | 2001-0085492 A | 9/2001 |
| WO | 0154470 A | 7/2001 |

* cited by examiner

FIG. 3 (a)

| IDENTIFICATION CODE | OBSTACLE NAME | Xmin [mm] | Ymin [mm] | Xmax [mm] | Ymax [mm] | H [mm] |
|---|---|---|---|---|---|---|
| A | COMPONENT CAMERA | 200 | 450 | 250 | 500 | 10 |
| B | NOZZLE STATION | 150 | 300 | 250 | 400 | 30 |
| C | MARK | 100 | 240 | 120 | 260 | 20 |
| D | CONVEYANCE RAIL | 0 | 180 | 200 | 200 | 10 |

FIG. 3 (b)

| | X [mm] | Y [mm] |
|---|---|---|
| MOUNTING POSITION ON CIRCUIT BOARD | 100 | 100 |

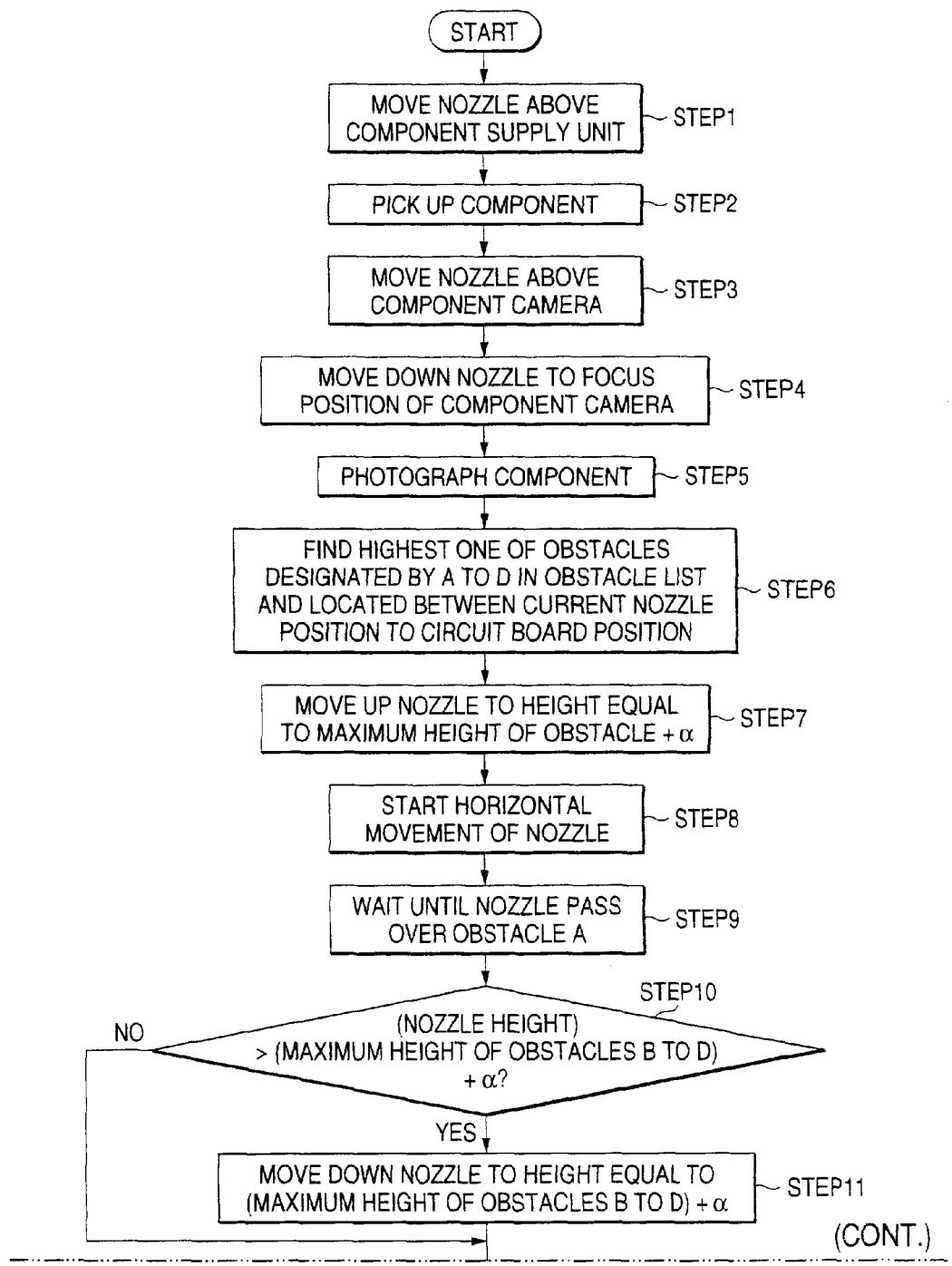

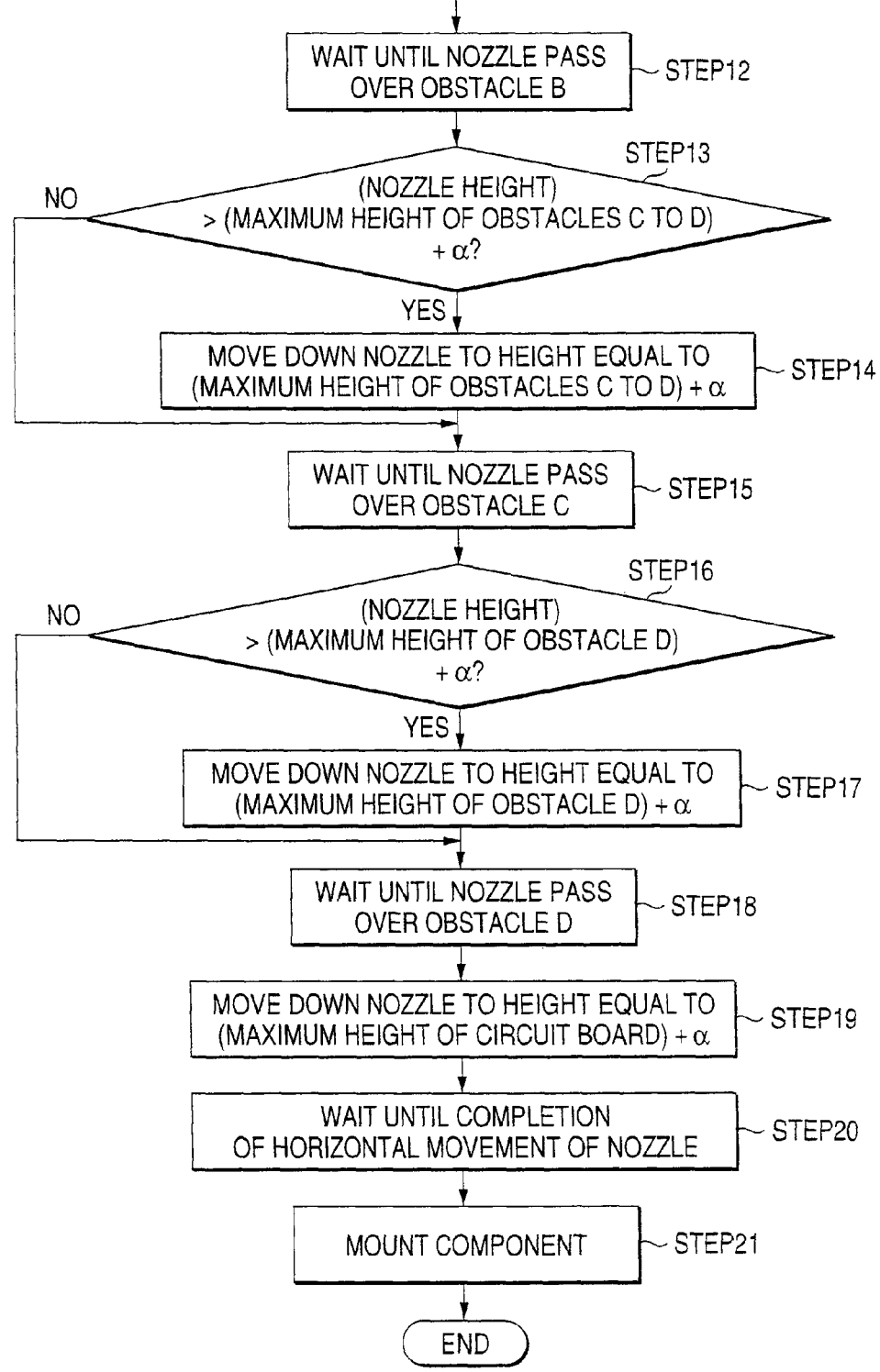

PRIOR ART

COMPONENT MOUNTING METHOD

CROSS-REFERENCE TO RELATED APPLICATIONS

This application is a division of U.S. patent application Ser. No. 10/553,588 filed Oct. 17, 2005, now issued as U.S. Pat. No. 7,337,533, which is a 371 of International Application No. PCT/JP04/05194 filed Apr. 12, 2004 and is incorporated herein by reference in its entirety.

TECHNICAL FIELD

The present invention relates to a component mounting apparatus and a component mounting method for mounting an electronic component on a board.

BACKGROUND ART

In a component conveyance height controlling method according to the background art, a nozzle height is updated based on a mounting height of a component mounted on a board and a height of a component sucked by the nozzle. While the nozzle is holding and moving the electronic component, the nozzle is kept at a fixed height. The height to be taken into consideration is only the height of the electronic component. Particularly because the nozzle is not changed in height during moving, there is a problem that an elevating stroke of the nozzle for mounting the component after the nozzle has reached above the circuit board is large (e.g. See Patent Document 1).

In addition, there is another component conveyance height controlling method, in which a moving head is triggered to start to move horizontally as soon as a lower end portion of a nozzle which is moving up reaches a predetermined interference avoidance height. There is, however, no consideration about the operation for moving the nozzle down. Thus, there is a problem that an operation for moving the nozzle up and down is not optimized (e.g. See Patent Document 2).

There is further another component conveyance height controlling method, in which a plurality of nozzles are moved down and made to stand by at a height high enough not to interfere with mounted components and a plurality of the nozzles are then moved down to mount components. However, there is no consideration of the height of each nozzle before the nozzle reaches above a circuit board. Therefore, there is a problem that an elevating stroke of a first nozzle mounting a component is so large that no effect can be exerted unless the equipment is provided with a plurality of nozzles (e.g. see Patent Document 3).

A technique according to the background art will be described below in detail with reference to FIG. 12.

FIG. 12 is an example of the configuration of a component mounting apparatus for mounting a component by use of an XY robot. An XY robot 53 driven by an X-axis motor 51 and a Y-axis motor 52 is used. A mounting head 54 mounted on the XY robot 53 is disposed so as to be movable desirably in a horizontal plane. A nozzle 55 and a Z-axis motor 56 for moving the nozzle up/down desirably are attached to the mounting head 54. Electronic components are received in a component supply unit 57. A circuit board 58 is fixed by a pair of opposed conveyance rails 59. One cycle of electronic component mounting operation includes a component suction operation, a component recognition operation, and a component mounting operation. In the component suction operation, the nozzle 55 moves above the component supply unit 57 and descends to pick up an electronic component from the component supply device 57. In the component recognition operation, the nozzle 55 moves above a component camera 60 so as to photograph the posture of the electronic component through the component camera 60. In the component mounting operation, the nozzle 55 moves above the circuit board 58 and descends to mount the electronic component on the circuit board 58. Such a cycle of the electronic component mounting operation is performed repetitively so as to mount a plurality of electronic components. A board camera 61 for photographing the position of the circuit board is provided in the mounting head 54 and used for checking the position of the circuit board 58 prior to component mounting. Spare nozzles are received in a nozzle station 62. In order to correct the position of the mounting head 54, a reference mark 63 capable of being photographed by the board camera 61 may be provided.

Since it is necessary to locate the aforementioned component camera 60, nozzle station 62 and reference mark 63 in a movable range of the mounting head 54, the aforementioned component camera 60, nozzle station 62 and reference mark 63 are usually disposed between the circuit board 58 and the component supply unit 57. In the configuration as shown in FIG. 12, there is a possibility that the nozzle 55 may pass over the component camera 60, the nozzle station 62, the reference mark 63 and one of the conveyance rails 59 before the nozzle arrives above a component mounting position on the circuit board 58 after the nozzle has picked up a component from the component supply unit 57 and recognized the component through the component camera 60. These component camera 60, nozzle station 62, reference mark 63 and conveyance rails 59 are disposed respectively in required positions and at required heights, but not allowed to be moved easily in order to ensure accuracy. Accordingly, a height high enough not to interfere with each of these obstacles (the component camera, the nozzle station, the reference mark, and the conveyance rail) has to be ensured as the height with which the nozzle 55 moves.

(Patent Document 1) Japanese Patent Publication JP-A-9-214182/(1997)

(Patent Document 2) Japanese Patent Publication JP-A-2002-111284

(Patent Document 3) Japanese Patent Publication JP-A-11-330786/(1999)

DISCLOSURE OF THE INVENTION

In the aforementioned configuration, the nozzle 55 is moved while a height high enough not to interfere with each of the obstacles (the component camera, the nozzle station, the reference mark, the conveyance rail, etc.) is ensured as the height with which the nozzle moves. Even after the nozzle 55 has reached above the board, the nozzle 55 still moves at the same height. For this reason, when the nozzle 55 having arrived above a component mounting position on the circuit board is to mount the component, an elevating stroke of the nozzle 55 is so large that the production efficiency is lowered.

As shown in FIG. 13, a moving trajectory of the nozzle 55 at the time of mounting a component is as follows. The nozzle 55 is moved horizontally at a fixed height with a component height being set at Ha ((1) in FIG. 13). As soon as the nozzle 55 has reached just above a component mounting position P0, the nozzle 55 is stopped from moving horizontally and is moved down vertically by a height ΔH ((2) in FIG. 13) so as to mount the electronic component on the board 58. After that, the nozzle 55 is moved up vertically ((3) in FIG. 13). As soon as the nozzle 55 has reached a predetermined height, the nozzle 55 is stopped from moving up but is made to start to move horizontally ((4) in FIG. 13). To this end, times are required respectively for the horizontal movement operation and the elevating operation of the nozzle 55. Therefore, the operation time becomes so long that the production efficiency is lowered.

The present invention is to solve the foregoing problems. An object of the present invention is to provide a component mounting apparatus and a component mounting method in which time to move a nozzle can be shortened so that production efficiency can be improved.

A component mounting apparatus according to the present invention is a component mounting apparatus including: a nozzle for holding a component at its lower end, the component being supplied from a component supply unit; a nozzle elevating means for moving the nozzle up/down; a nozzle moving means for moving the aforementioned nozzle horizontally; obstacles higher than a height with which the component is picked up from the aforementioned component supply unit or a height with which the component is to be mounted on a board conveyed by conveyance rails; and a control means for controlling the aforementioned nozzle elevating means and the aforementioned nozzle moving means so that the component moved by the aforementioned nozzle moving means is mounted on the aforementioned board. The component mounting apparatus is characterized in that: the aforementioned control means stores positions and heights of a plurality of the obstacles disposed between the aforementioned component supply unit and the aforementioned board; and when the aforementioned nozzle having picked up the component in a position to pick up the component from the aforementioned component supply unit is to move to a position to mount the component on the aforementioned board, the control means locates the aforementioned nozzle at a height high enough not to interfere with a first one of the obstacles and then moves the nozzle to a height high enough not to interfere with a next one of the obstacles in sync with the time when the nozzle has finished passing over the first obstacle.

The component mounting apparatus is further characterized in that: the obstacles include at least one of a component camera for photographing the component from below the aforementioned nozzle, one of the conveyance rails for conveying the aforementioned board, a nozzle station for storing spare nozzles, and a reference mark provided between the aforementioned component supply unit and the aforementioned board and for performing position correction; and after the component has been photographed by the aforementioned component camera, the aforementioned nozzle is moved down in sync with the time when the nozzle has finished passing over the component camera, the aforementioned nozzle is moved down in sync with the time when the aforementioned nozzle has finished passing over the conveyance rail, the aforementioned nozzle is moved down in sync with the time when the aforementioned nozzle has finished passing over the aforementioned nozzle station, or the aforementioned nozzle is moved down in sync with the time when the aforementioned nozzle has finished passing over the aforementioned reference mark.

A component mounting apparatus according to another aspect of the invention is a component mounting apparatus including: a nozzle for holding a component at its lower end, the component being supplied from a component supply unit; a nozzle elevating means for moving the nozzle up/down; a nozzle moving means for moving the aforementioned nozzle horizontally; obstacles higher than a height with which the component is picked up from the aforementioned component supply unit or a height with which the component is to be mounted on a board conveyed by conveyance rails; and a control means for controlling the aforementioned nozzle elevating means and the aforementioned nozzle moving means so that the component moved by the aforementioned nozzle moving means is mounted on the aforementioned board. The component mounting apparatus is characterized in that: the aforementioned control means stores positions and heights of a plurality of the obstacles disposed between the aforementioned component supply unit and the aforementioned board; and when the aforementioned nozzle having picked up the component in a position to pick up the component from the aforementioned component supply unit is to move to a position to mount the component on the aforementioned board, the control means determines a horizontal path to allow the nozzle to move to a component mounting position on the board while keeping a predetermined height, and moves the nozzle in the horizontal path. Thus, the nozzle can move with the height of the nozzle at a required minimum height.

A component mounting apparatus according to another aspect of the invention is a component mounting apparatus including: a nozzle for holding a component at its lower end so as to mount the component on a board, the component being supplied from a component supply unit; a nozzle elevating means for moving the nozzle up/down; a nozzle moving means for moving the aforementioned nozzle horizontally; and a control means for controlling the aforementioned nozzle elevating means and the aforementioned nozzle moving means so that the component moved by the aforementioned nozzle moving means is mounted on the aforementioned board. The component mounting apparatus is characterized in that: the aforementioned control means controls the aforementioned nozzle elevating means so that the aforementioned nozzle approaches a component mounting region movement height close to the aforementioned board when the nozzle has arrived in a component mounting region above the aforementioned board; and the aforementioned control means controls the aforementioned nozzle moving means so that the nozzle holding the aforementioned component at the aforementioned component mounting region movement height is moved to a component mounting position on the aforementioned board so as to mount the aforementioned component from the aforementioned component mounting region movement height to the aforementioned component mounting position. Thus, it is possible to shorten an elevating stroke of the nozzle at the time of mounting the component so that it is possible to improve the production efficiency.

The component mounting apparatus is further characterized in that board marks provided on end portion sides of the aforementioned board are recognized, and the aforementioned component mounting region is calculated based on the recognized board marks.

The component mounting apparatus further includes: a conveyance rail movable in accordance with a width of the board to be conveyed; and a position detection means for detecting a position of the conveyance rail. The component mounting apparatus is characterized in that the aforementioned component mounting region is calculated from information of the position of the conveyance rail detected by the position detection means.

The component mounting apparatus is further characterized in that the aforementioned component mounting region movement height is a height defined in consideration of a height of each component mounted on the board, a height of the component held by the nozzle, and a gap necessary for the nozzle to move.

The component mounting apparatus is further characterized in that when the aforementioned component is to be mounted from the aforementioned component mounting region movement height to the component mounting position of the aforementioned board, the aforementioned control means drives the aforementioned nozzle elevating means and the aforementioned nozzle moving means simultaneously so as to move the aforementioned nozzle in an arc moving trajectory. Thus, it is possible to shorten time for moving the nozzle at the time of mounting the component so that it is possible to improve the production efficiency.

A component mounting method according to one aspect of the invention is a component mounting method including the steps of: using a nozzle to hold a component at its lower end, the component being supplied from a component supply unit; moving the nozzle up/down and horizontally while avoiding obstacles higher than a height with which the component is picked up from the aforementioned component supply unit or a height with which the component is to be mounted on a board conveyed by conveyance rails; and mounting the aforementioned component on the board. The component mounting method is characterized in that: positions and heights of a plurality of the obstacles disposed between the aforementioned component supply unit and the aforementioned board are stored; and when the aforementioned nozzle is to move from a position to pick up the component from the aforementioned component supply unit to a position to mount the picked-up component on the aforementioned board, a highest one is found from the aforementioned plurality of obstacles, the aforementioned nozzle is moved up to a height high enough not to interfere with the aforementioned highest obstacle, the nozzle is moved horizontally, a current height of the nozzle is compared with a height of an obstacle the nozzle will pass over as soon as the nozzle has finished passing over the aforementioned highest obstacle, and the nozzle is moved down to a height high enough not to interfere with the aforementioned obstacle the nozzle will pass over when the nozzle is higher than the height of the obstacle.

A component mounting method according to another aspect of the invention is a component mounting method including the steps of: using a nozzle to hold a component at its lower end, the component being supplied from a component supply unit; moving the nozzle up/down and horizontally; and mounting the aforementioned component on the board. The component mounting method is characterized in that: the aforementioned nozzle is made to approach a component mounting region movement height close to the aforementioned board when the nozzle has arrived in a component mounting region above the aforementioned board; the aforementioned nozzle holding the aforementioned component at the aforementioned component mounting region movement height is moved to a component mounting position on the aforementioned board; and the aforementioned component is mounted from the aforementioned component mounting region movement height to the aforementioned component mounting position. Thus, it is possible to shorten an elevating stroke of the nozzle at the time of mounting the component so that it is possible to improve the production efficiency.

The component mounting method is further characterized that a horizontal movement operation and an elevating operation are performed simultaneously so as to move the aforementioned nozzle in an arc moving trajectory when the aforementioned component is to be mounted on the aforementioned board. Thus, it is possible to shorten time for moving the nozzle at the time of mounting the component so that it is possible to improve the production efficiency.

According to aspects of the invention, it is possible to move down the nozzle in accordance with the height and position of each obstacle while overlapping with the obstacle when the nozzle is to be moved from the component supply portion to the board. Accordingly, when the nozzle has arrived at the mounting point above the board, the height of the nozzle can be set at a required minimum value so that the elevating stroke of the nozzle at the time of mounting the component becomes shortest.

According to the present invention, it is possible to shorten the elevating stroke of the nozzle at the time of mounting the component in the component mounting apparatus so that it is possible to save the time required for elevating the nozzle. Thus, it is possible to provide a component mounting apparatus and a component mounting method with higher production efficiency than that according to the background art. In addition, it is possible to more greatly shorten the time required for elevating the nozzle because the nozzle is moved and elevated in an arc trajectory. Thus, it is possible to provide a component mounting apparatus and a component mounting method with higher production efficiency than that according to the background art.

BRIEF DESCRIPTION OF THE DRAWINGS

FIGS. 3(a) and 3(b) are views showing tables of numerical values concerned with positions and heights of obstacles in FIG. 1;

FIG. 4 is a flow chart of FIG. 2;

Figure 1:
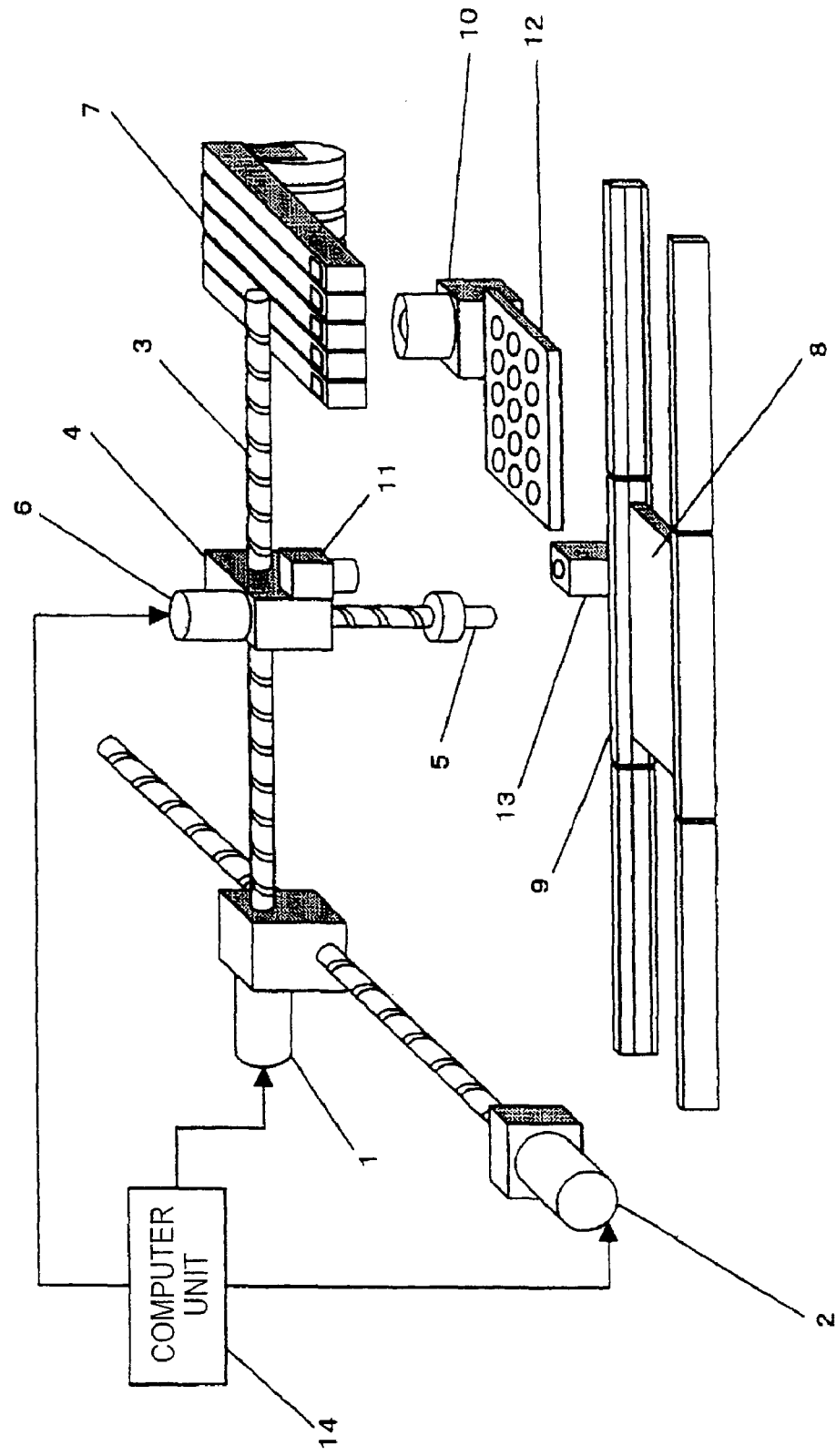
FIG. 1 is a perspective view of a component mounting apparatus showing an embodiment of the present invention.

Incidentally, a reference numeral 5, 22 in the drawings designates a nozzle; 1, 2, 3, a nozzle moving means; 6, a nozzle elevating means; 7, 21, a component supply unit; 10, 23, a component camera (an example of an obstacle); 9, 26, a conveyance rail (an example of an obstacle); 12, 24, a nozzle station (an example of an obstacle); 13, 25, a reference mark (an example of an obstacle); 14, a computer unit (a control means); 39, an encoder; 40, an encoder sensor; 41, a board mark; 42, an origin sensor; and 43, an origin protrusion.

BEST MODE FOR CARRYING OUT THE INVENTION

Embodiments of the present invention will be described with reference to FIGS. 1 through 11.

(Embodiment 1)

FIGS. 1 through 4 show a component mounting apparatus according to a first embodiment of the present invention. In FIG. 1, the component mounting apparatus using an XY robot to mount components is shown. An XY robot 3 (nozzle moving means) driven by an X-axis motor 1 and a Y-axis motor 2 is used. A mounting head 4 attached to the XY robot 3 is disposed to be movable desirably in a horizontal plane. A nozzle 5 and a Z-axis motor 6 (nozzle elevating means) for moving the nozzle 5 up/down desirably are attached to the mounting head 4. Electronic components are received in a component supply unit 7.

As a method for fixing a circuit board 8, it is possible to use a pair of opposed conveyance rails 9 etc. One cycle of electronic component mounting operation includes a component suction operation, a component recognition operation and a component mounting operation. In the component suction operation, the nozzle 5 moves above the component supply unit 7 and descends to pick up an electronic component from the component supply unit 7. In the component recognition operation, the nozzle 5 moves above a component camera 10 so as to photograph a posture of the electronic component through the component camera 10. In the component mounting operation, the nozzle 5 moves above the circuit board 8 and descends to mount the electronic component on the circuit board 8. Such a cycle of the electronic component mounting operation is performed repetitively so as to mount a plurality of electronic components.

A board camera 11 for photographing a position of the circuit board 8 may be provided in the mounting head 4. In the case where the mounting head 4 is equipped with the board camera 11, the position of the circuit board 8 is checked prior to component mounting. Spare nozzles are received in a nozzle station 12 in advance. In order to correct the position of the mounting head 4, a reference mark 13 capable of being photographed by the board camera 11 may be provided. The X-axis motor 1, the Y-axis motor 2, and the Z-axis motor 6 are connected to a computer unit 14 (control means) so as to operate in accordance with an instruction from the computer unit 14.

Since it is necessary to locate the aforementioned component camera 10, nozzle station 12 and reference mark 13 in a movable range of the mounting head 14, the aforementioned component camera 10, nozzle station 12 and reference mark 13 are usually disposed between the circuit board 8 and the component supply unit 7. Thus, the configuration shown in FIG. 1 is formed. There is a possibility that the nozzle 5 may pass over the component camera 10, the nozzle station 12, the reference mark 13 and one of the conveyance rails 9 before the nozzle 5 arrives above a component mounting position on the circuit board 8 after the nozzle 5 has picked up a component from the component supply unit 7 and recognized the component through the component camera 10.

These component camera 10, nozzle station 12, reference mark 13 and conveyance rails 9 are disposed respectively in required positions and at required heights, but not allowed to be moved easily in order to ensure accuracy. Accordingly, it is necessary to perform an operation with a movement height of the nozzle 5 high enough not to interfere with each of these obstacles (the component camera, the nozzle station, the reference mark and the conveyance rail). The computer unit 14 controls such an operation in the following manner.

Figure 2:
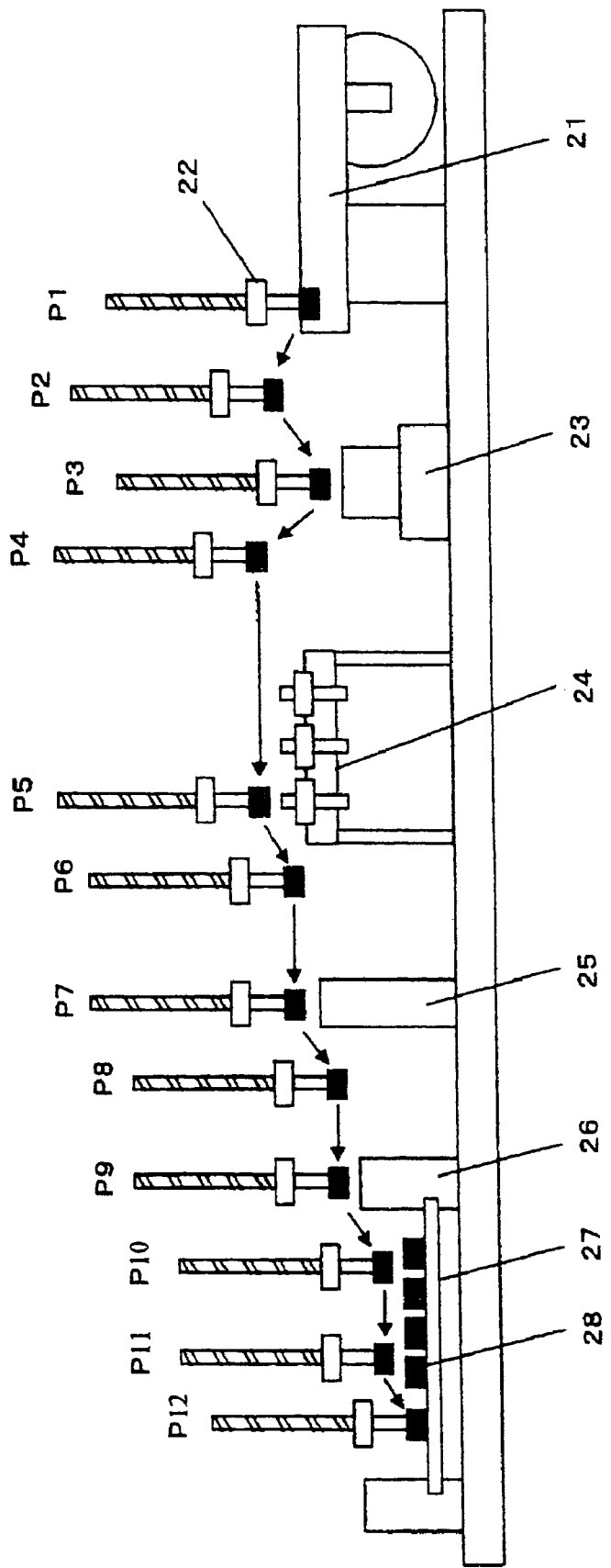
FIG. 2 is a view showing the relation between a nozzle and each obstacle according to Embodiment 1 of the present invention.
Figure 5:
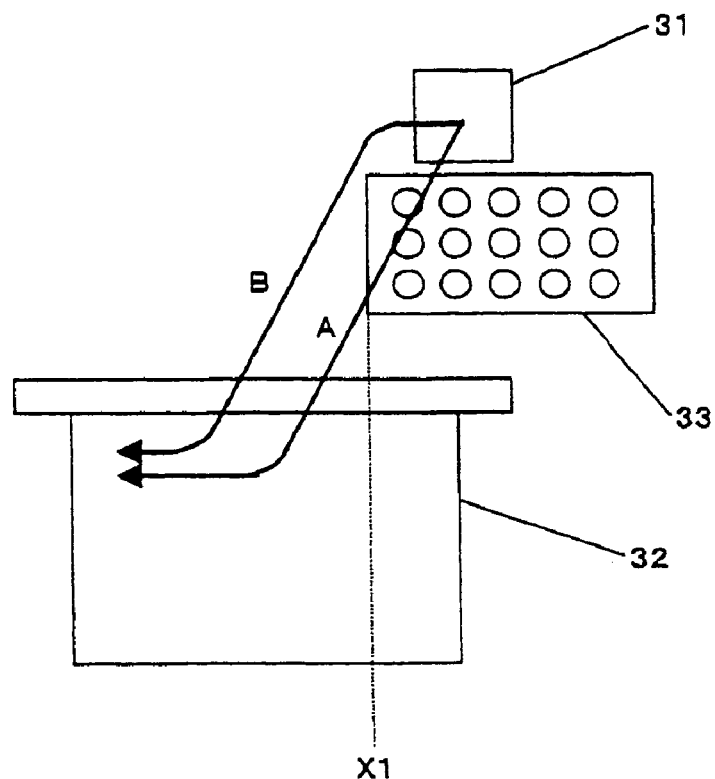
FIGS. 5(a) and 5(b) are views showing the relation between a nozzle and an obstacle according to Embodiment 2 of the present invention.
Figure 5:
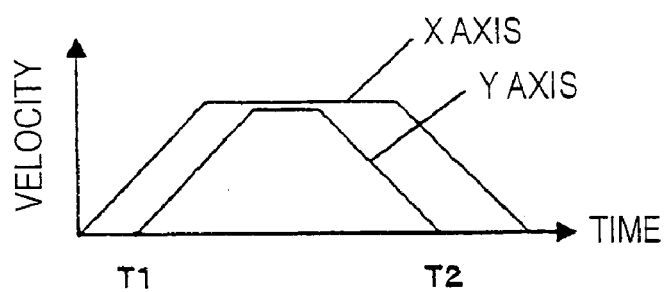

FIG. 2 shows an example of nozzle height control from component supply to component mounting. When a nozzle 22 picks up an electronic component from a component supply unit 21, the nozzle 22 is in a position P1. The nozzle 22 ascends once in order to hold the electronic component at its lower end and lift up the electronic component, and the nozzle 22 moves to a position P2. Then, the nozzle 22 moves to a position P3 so as to adjust the focus of a component camera 23 on the electronic component. After photographing of the electronic component is terminated, the nozzle 22 ascends to a position P4 high enough not to interfere with a nozzle station 24 which is an obstacle, and the nozzle 22 moves horizontally to a position P5 where the nozzle 22 finishes passing over the nozzle station 24.

Then, the nozzle 22 descends to a position P6 high enough not to interfere with a mark 25 which is the next obstacle, and the nozzle 22 moves horizontally to a position P7 where the nozzle 22 finishes passing over the mark 25. Then, the nozzle 22 descends to a position P8 high enough not to interfere with a conveyance rail 26 which is the next obstacle, and the nozzle 22 moves horizontally to a position P9 where the nozzle 22 finishes passing over the conveyance rail 26. Then, the nozzle 22 descends to a position P10 high enough not to interfere with electronic components 28 having already been mounted on a circuit board 27 which is the next obstacle, and the nozzle 22 moves horizontally to a neighbor position P11 where the nozzle 22 will mount the component next time. Then, in order to mount the electronic component, the nozzle 22 descends to a position P12 where the nozzle 22 completes one cycle of the mounting operation.

The computer unit (control means) needs to have information about the positions and heights of the obstacles located between the component supply unit and the circuit board. An example thereof will be described with reference to FIGS. 3(a) and 3(b). FIG. 3(a) is a list of obstacles between the component supply unit and the circuit board. In the list of obstacles, information about the positions (Xmin, Ymin, Xmax, Ymax) and heights (H) of the obstacles are set in advance with identification codes A to D being given to the obstacles in accordance with the order in which the nozzle will pass the obstacles before the nozzle moves horizontally above the circuit board after a component held by the nozzle is photographed by the component camera.

In this example, the component camera is on the plus side of the Y axis while the circuit board is on the minus side of the Y axis. Accordingly, the identification codes A to D are given in a descending order of the positions Ymin of the obstacles. The X direction may be also taken into consideration. When a mounting position on the circuit board is, for example, set as shown in FIG. 3(b), a moving stroke of the XY robot in the Y direction is longer than that in the X direction. Therefore, for the sake of simplification of processing, it will be sufficient if only the Y direction is taken into consideration because it takes a longer time for movement in the Y direction. In the case where the stroke in the X direction is longer, only the X direction may be taken into consideration on the contrary.

The obstacle list may be registered into the computer by a person, or may be registered based on automatic measurement of the board camera etc. When only the conveyance rail, the nozzle station, the component camera or the reference mark is registered in this obstacle list, requirements of claim 2, 3, 4 or 5 can be satisfied.

An example of control algorithm for performing the nozzle height control as shown in FIG. 2 will be described in accordance with the obstacle list shown in FIG. 3 and with reference to FIG. 4. FIG. 4 is an example of a flow chart executed by the computer unit (control means) used in claims 1 through 5, showing one cycle of processing from component pick-up to component mounting.

In Step 1, the nozzle is moved horizontally above the component supply unit in order to pick up a component. In Step 2, the electronic component is picked up. The component can be picked up by a method of sucking the air through a lower end of the nozzle so as to make the nozzle suck and hold the electronic component or by a method of holding the electronic component by means of the nozzle with a mechanical chuck. In Step 3, the nozzle is moved horizontally above the component camera so as to be ready for photographing the electronic component.

In Step 4, the nozzle is moved down to the focal height of the component camera. In Step 5, the component camera is used to photograph the electronic component held by the nozzle. As a method of photographing the component, it is possible to use a method of photographing the component while moving the nozzle and the component camera relatively to each other so as to shorten the photographing time, as well as a method of photographing the component with the nozzle being stopped. Particularly in the case of a mounting head where a plurality of nozzles are arranged in one row, the former method is effective.

In Step 6, the obstacle list shown in FIG. 3(a) by way of example is searched to find a highest one of the obstacles located between the current position of the nozzle and the position of the circuit board. In the case of FIG. 3(a), the nozzle station with the identification code B is the highest. Incidentally, in this search, obstacles out of a movement path of the nozzle may be excluded from the search. In order to simplify the processing, all the obstacles may be intended for the search. In Step 7, the nozzle is moved up to a height equal to a sum of a height (the largest height of the obstacle) and $\alpha$ ($\alpha$ designates a margin to be added for avoiding interference).

In Step 8, horizontal movement of the nozzle toward the circuit board is started. In Step 9, it is determined whether the nozzle has finished passing over the obstacle A or not while X- and Y-coordinate positions of the nozzle are monitored. When it is concluded that the nozzle has finished passing over the obstacle A, the routine of processing advances to a next step. The X and Y coordinates of the nozzle can be obtained as follows. For example, when the motors are servo motors, the X and Y coordinates of the nozzle can be read from encoders attached to the motors. When the motors are pulse motors, the X and Y coordinates of the nozzle can be obtained by counting pulses given to the motors. In Step 10, the current height of the nozzle is compared with a sum of the height of an obstacle (largest height of the obstacles B to D) the nozzle will pass over, and $\alpha$. Here, only when the nozzle is higher, the routine of processing goes to Step 11, in which the nozzle is moved down to the height equal to the sum of (the largest height of the obstacles B to D) and $\alpha$.

Incidentally, when the obstacle A is out of the movement path of the nozzle, Steps 9 to 11 does not have to be executed. For the sake of simplification of the processing, Steps 9 to 11 may be executed whether the obstacle A is out of the movement path of the nozzle or not. In Step 12, it is determined whether the nozzle has finished passing over the obstacle B or not while the X- and Y-coordinate positions of the nozzle are monitored. When it is concluded that the nozzle has finished passing over the obstacle B, the routine of processing advances to a next step.

In Step 13, the current height of the nozzle is compared with a sum of the height of an obstacle the nozzle will pass over (largest height of the obstacles C to D), and $\alpha$. Here, only when the nozzle is higher, the routine of processing goes to Step 14, in which the nozzle is moved down to the height equal to the sum of (the largest height of the obstacles C to D) and $\alpha$.

In Step 15, it is determined whether the nozzle has finished passing over the obstacle C or not while the X- and Y-coordinate positions of the nozzle are monitored. When it is concluded that the nozzle has finished passing over the obstacle C, the routine of processing advances to a next step.

In Step 16, the current height of the nozzle is compared with a sum of the height of an obstacle the nozzle will pass over (largest height of the obstacle D), and $\alpha$. Here, only when the nozzle is higher, the routine of processing goes to Step 17, in which the nozzle is moved down to the height equal to the sum of (the largest height of the obstacle D) and $\alpha$.

In Step 18, it is determined whether the nozzle has finished passing over the obstacle D or not while the X- and Y-coordinate positions of the nozzle are monitored. When it is concluded that the nozzle has finished passing over the obstacle D, the routine of processing advances to Step 19, in which the nozzle is moved down to the height equal to a sum of (the largest height of the circuit board) and $\alpha$. Here, as for the largest height of the circuit board, the largest height of components having been mounted on the circuit board may be stored in advance and used, or a predetermined value may be used for the sake of simplification of the processing.

In Step 20, the routine waits until the completion of horizontal movement of the nozzle toward the circuit board. In Step 21, the component is mounted on the circuit board. As a method for mounting the component, it is possible to use a method of releasing suction of the air through the lower end of the nozzle, or a method of opening a mechanical chuck when the nozzle includes the mechanical chuck. In the aforementioned manner, one cycle of the component mounting operation is terminated.

(Embodiment 2)

FIGS. 5(a) and 5(b) show a component mounting method according to a second embodiment of the present invention. Assume that an obstacle 33 with a large height is located between a component camera 31 and a mounting position on a circuit board 32, as shown in FIG. 5(a). In this case, when both the X-axis motor and the Y-axis motor are rotated simultaneously, the nozzle passes along a path of an arrow A to thereby pass over the obstacle 33. On the other hand, when the nozzle passes along a path of an arrow B, the nozzle does not pass over the obstacle 33. Thus, the nozzle can be moved horizontally with the nozzle height constant.

FIG. 5(b) shows an example of a method for controlling a path of the nozzle. At the beginning, the X-axis motor starts to rotate. At a time T1 when the X coordinate of the nozzle goes to a position X1 out of the range of an obstacle, the Y-axis motor starts to rotate. Then, if the X axis has not arrived at its intended position at a time T2 when the Y-axis motor has arrived at its intended position, delay in the start of the Y axis will be put within the movement time range of the X axis. Thus, there will be no loss.

In the case where such a path is established, the nozzle is moved not in the ordinary path A but in the path B where the nozzle can avoid the obstacle. Although FIG. 5(b) shows the case where timings to start moving the motors are changed by way of example, velocities or accelerations of the motors may be changed, or a path based on a combination of these methods may be used. When avoidance of the obstacle increases the loss of time, the obstacle maybe avoided by controlling the height of the nozzle as in the method shown in FIG. 2.

Figure 6:
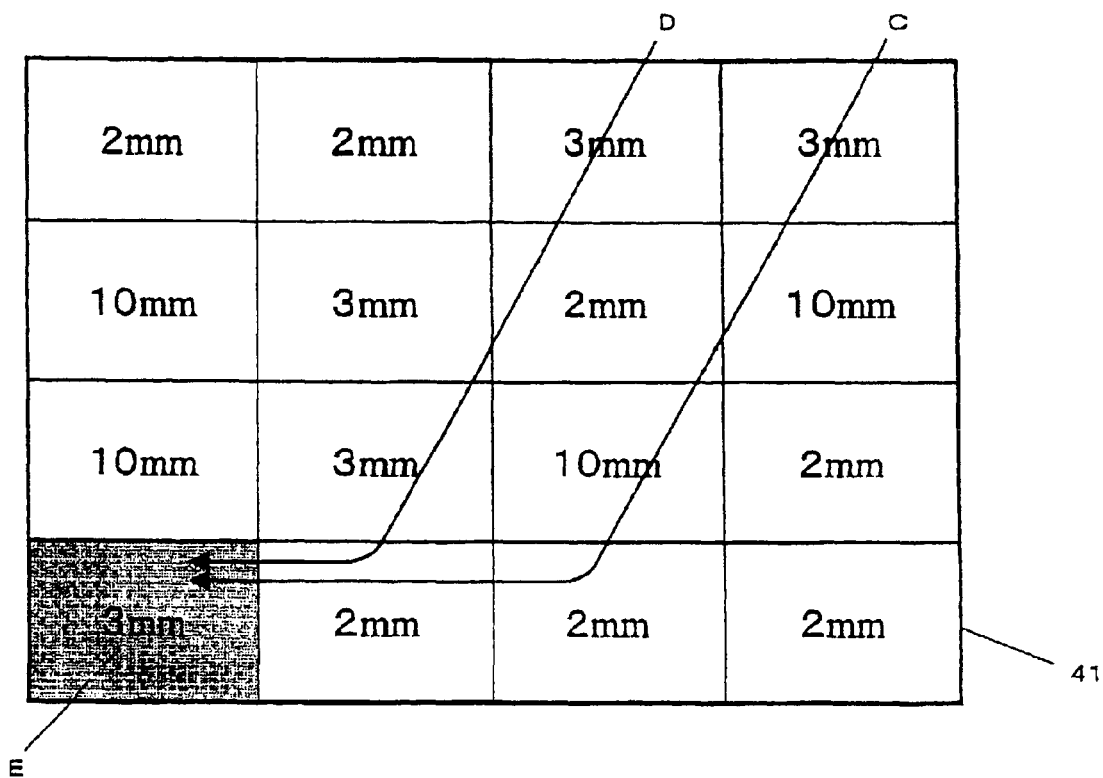
FIG. 6 is a view showing a table of numerical values of heights from a board in the Embodiment 2 of the present invention.

FIG. 6 shows data about heights of components mounted on a circuit board 41, which data are stored in the computer unit (control means) in accordance with each region of the circuit board 41. The data are updated in real time whenever any electronic component is mounted on the circuit board. Here, assume that a position to mount next time belongs to an area E. In this case, when the nozzle is moved in a path of an arrow C, it is necessary to move the nozzle horizontally at a height high enough to allow the nozzle to pass over a component having a height of 10 mm. When the nozzle is moved in a path of an arrow D, the nozzle may be moved horizontally at a height high enough to allow the nozzle to pass over a component having a height of 3 mm. Thus, the height of the nozzle at the time of horizontal movement can be reduced by 7 mm. As a result, an elevating stroke of the nozzle at the time of component mounting can be reduced by 7 mm so that time to elevate the nozzle can be shortened and the production efficiency can be improved. Incidentally, as a method for controlling a nozzle movement path, it is possible to use the same method as that described in FIG. 5(b).

(Embodiment 3)

A third embodiment of the present invention will be described below.

Figure 7:
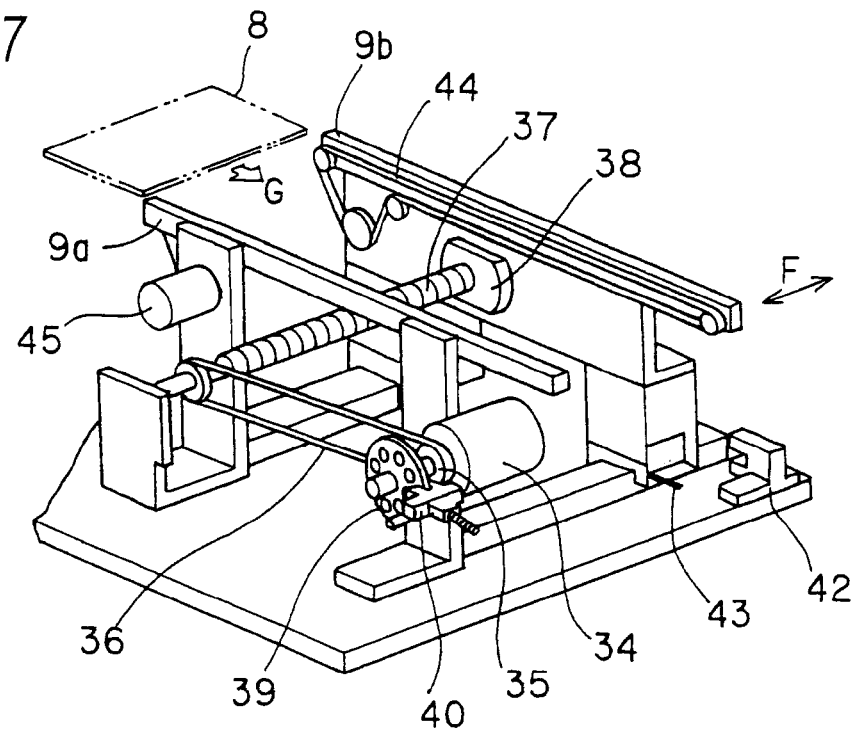
FIG. 7 is a schematic perspective enlarged view of an automatic width adjustment mechanism for automatically adjusting a width between conveyance rails in the component mounting apparatus.

FIG. 7 shows a schematic perspective enlarged view of an automatic width adjustment mechanism for automatically adjusting a width between conveyance rails in a component mounting apparatus.

Respective parts of the automatic width adjustment mechanism will be described below. A rail width adjustable drive motor 34 is a servo motor. The rail width adjustable drive motor 34 is rotated by electric power supplied under control of the aforementioned computer unit 14, so as to drive a feed screw 37 through a toothed belt pulley 35 and a toothed belt 36. Accordingly, when the rail width adjustable drive motor 34 is rotated forward/backward, a movable conveyance rail 9b can be moved forward/backward in a right-left direction perpendicular to the rail, as shown by an arrow F in FIG. 7, through the toothed belt pulley 35, the toothed belt 36, the feed screw 37 and a feed screw nut 38.

An encoder 39 rotates in accordance with rotation of the rail width adjustable drive motor 34. An encoder 40 is disposed in a position to sandwich a peripheral portion of the encoder 39 from its opposite sides. The encoder 40 is formed into a "U" shape. The encoder 40 includes a light emitting portion comprised of a light emitting device, and a light receiving portion comprised of a phototransistor. The encoder 40 is driven based on the control of the computer unit 14. At the time of driving, the aforementioned light receiving portion is turned OFF when receiving light with a specific wavelength radiated from the light emitting portion, and the light receiving portion is turned ON when the light is blocked. Accordingly, the light receiving portion repeats the light receiving (OFF) state and the light blocking (ON) state in accordance with rotation of the encoder 39. The encoder 40 detects slits of the rotating encoder 39 based on the ON/OFF states of the light receiving portion, and outputs the number of the detected slits to the computer unit 14 as the number of encoder pulses (one pulse is made of ON and OFF of an encoder slit detection signal. The same thing will apply hereinafter). The computer unit 14 recognizes a rotation angle of the rail width adjustable drive motor 34 based on this number of pulses so as to control and drive the rotation of the rail width adjustable drive motor 34.

An origin sensor 42 is also formed into a "U" shape. The origin sensor 42 also includes a light emitting portion comprised of a light emitting device, and a light receiving portion comprised of a phototransistor. The origin sensor 42 is driven based on the control of the computer unit 14. An origin protrusion 43 moves together with the movable rail 9b, and enters a space of the "U" shape of the aforementioned origin sensor 42. The origin protrusion 43 stops in the space in some cases and passes through the space in other cases. When passing through the space, the origin protrusion 43 blocks the light emitted from the light emitting portion. When the emitted light is blocked, the origin sensor 42 is turned on to notify the computer unit 14 of the detection of the origin protrusion 43, that is, the arrival of the movable rail 9b at the origin.

Incidentally, after the width adjustment on the movable rail 9b is completed, a board 8 is placed on a conveyor belt 44 and conveyed by a conveyor belt driving motor 45 from the upper left to the lower right as shown by an arrow G in FIG. 7. It is a matter of course that the board 8 may be conveyed from the lower right to the upper left in FIG. 7, with respect to the configuration of the width adjustment mechanism portion shown in FIG. 7. Thus, the position of the conveyance rail 9b is detected by a conveyance rail position detection means constituted by the encoder 39, the encoder sensor 40, the origin sensor 42, and the origin protrusion 43.

This automatic width adjustment mechanism operates based on board size data recorded in an NC program (mounting positions of components, supplied component information, board information, etc.) so that the movable rail 9b forms a desired rail width.

Figure 8:
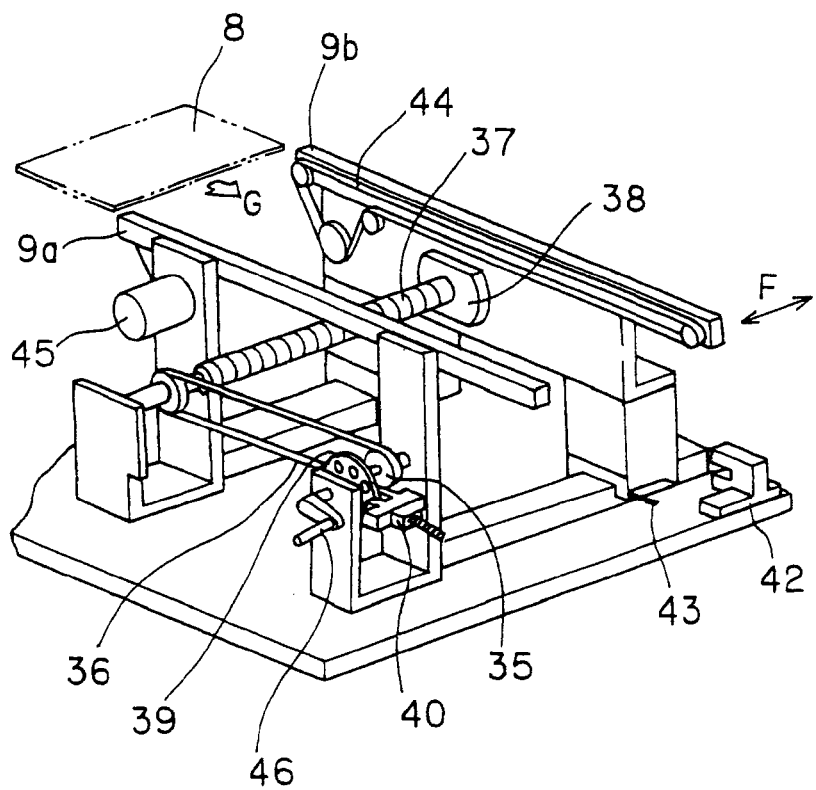
FIG. 8 is a schematic perspective enlarged view of a width adjustment mechanism for manually adjusting the width.

The aforementioned automatic width adjustment mechanism can manually change the rail width. FIG. 8 shows a schematic perspective enlarged view of the width adjustment mechanism for manually adjusting the width.

In this width adjustment mechanism, not the rail width adjustable drive motor 34 but the toothed belt pulley 35 is driven by rotation of a handle 46 so that the movable rail 9b can be moved forward/backward in a left-right direction perpendicular to the rail as shown by an arrow F in FIG. 8, through the toothed belt 36, the feed screw 37, and the feed screw net 38. Also in this configuration, the position of the conveyance rail 9b can be detected by the conveyance rail position detection means constituted by the encoder 39, the encoder sensor 40, the origin sensor 42, and the origin protrusion 43.

Next, a procedure for mounting a component using the aforementioned automatic width adjustment mechanism or the aforementioned manual width adjustment mechanism will be described.

Figure 9:
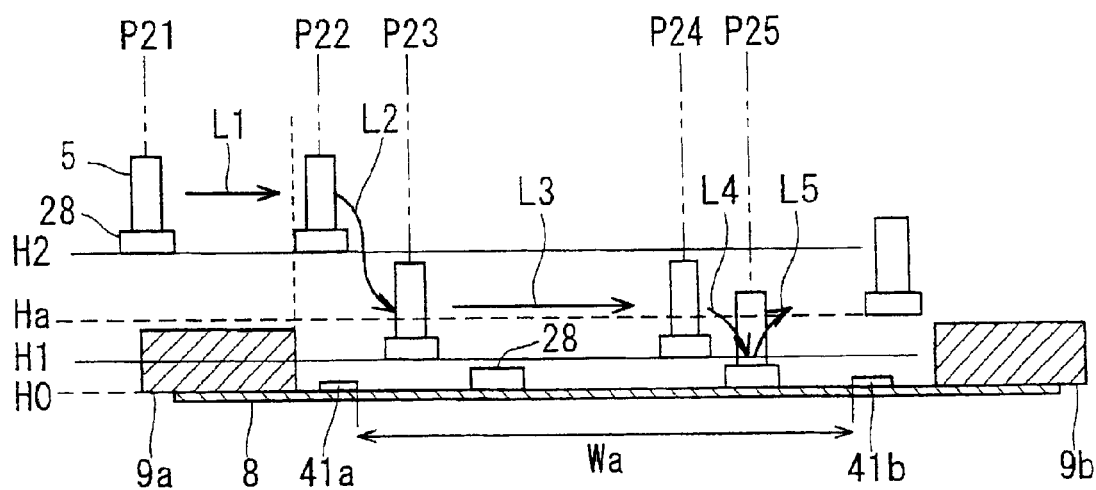
FIG. 9 is an explanatory view showing a moving trajectory of a nozzle in Embodiment 3 of the present invention.

FIG. 9 is an explanatory view of a method for moving a nozzle within a component mounting region above a board. Incidentally, parts common to those in the aforementioned component mounting apparatus in FIG. 1 are referenced correspondingly and duplicate description will be omitted.

As shown in FIG. 9, the computer unit 14 (see FIG. 1) serving as a control means controls and drives a nozzle moving means so as to move the nozzle 5 along an arrow L1 in FIG. 9 at a height H2 where an electronic component 28 held by the nozzle 5 as described above does not interfere with any obstacle in a position 21 outside the pair of conveyance rails 9a and 9b. When the nozzle 5 goes beyond the conveyance rail 9a, 9b (in a position P22) and arrives at a position P23 in a component mounting region Wa, the computer unit 14 controls and drives the nozzle elevating means so as to move down the nozzle 5 to a component mounting region movement height H1 close to the board 8 (an arrow L2 in FIG. 9). Accordingly, the nozzle 5 starts to descend before arrival in the component mounting region Wa while avoiding interference with any obstacle. Thus, the nozzle 5 reaches the component mounting region movement height H1 when the nozzle 5 has arrived in the component mounting region Wa. As for the timing to start to descend, for example, the nozzle 5 can start to descend in a place where the nozzle 5 goes just above the conveyance rail 9a, 9b or in a position which is near this place and in which the nozzle 5 does not interfere with the conveyance rail 9a, 9b.

The computer unit 14 controls the nozzle moving means so as to move the nozzle 5 holding the component 28 at the component mounting region movement height H1, along an arrow L3 in FIG. 9 and to a component mounting position P24 on the board 8. Then, the component 28 is mounted from the component mounting region movement height H1 to a component mounting position P25.

Here, when the nozzle 5 is to be moved down from the component mounting region movement height H1 so as to mount the component 28 on the board 8, the computer unit 14 controls and drives the nozzle elevating means and the nozzle moving means simultaneously so that the nozzle 5 descends in an arc moving trajectory (an arrow L4 in FIG. 9). When the mounting of the component 28 is completed, the nozzle 5 is moved up in an arc trajectory in the same manner as in the case of the descending.

Figure 10:
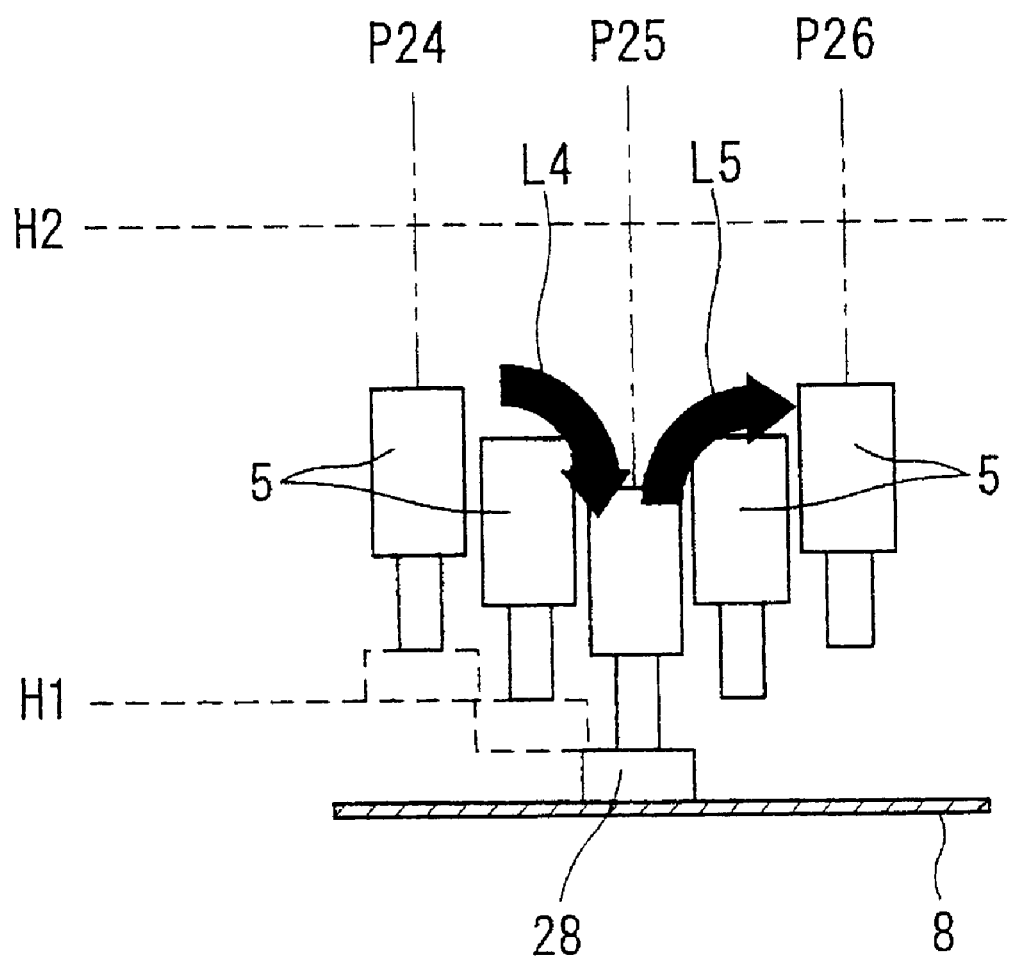
FIG. 10 is an explanatory view showing a moving trajectory of the nozzle at the time of mounting.

That is, as shown in FIG. 10, the computer unit 14 controls and drives the nozzle moving means and the nozzle elevating means simultaneously from the position P24 before the component mounting position so as to perform not only a horizontal movement operation but also a descending operation, to thereby move down the nozzle 5 in an arc trajectory (an arrow L4 in FIG. 10). After the component has been mounted on the board in the position P25, the computer unit 14 controls the nozzle moving means and the nozzle elevating means simultaneously so as to move up the nozzle 5 in an arc trajectory (an arrow L5 in FIG. 10). The nozzle 5 is controlled to reach the component mounting region movement height H1 again in a predetermined position P26. Incidentally, when the nozzle 5 may interfere with the component having already been mounted, the aforementioned operation using the arc trajectory cannot be used. Thus, in a region where the nozzle 5 may interfere with the mounted component, the nozzle 5 is moved down from just above the component mounting position.

Incidentally, the aforementioned component mounting region movement height H1 means a minimum height high enough for the nozzle 5 not to interfere with any obstacle such as any other component when the nozzle 5 moves within the component mounting region. For example, a height 5 mm higher than the surface of the board can be used as the component mounting region movement height H1. It is desired that this height is set to be low but high enough not to cause interference with any other component. Preferably, the height is set within the range of from a height 1 mm higher than the maximum component height to a height 10 mm higher than the surface of the board. More preferably, the height is set within the range of from a height 3 mm to 7 mm higher than the surface of the board.

Figure 11:
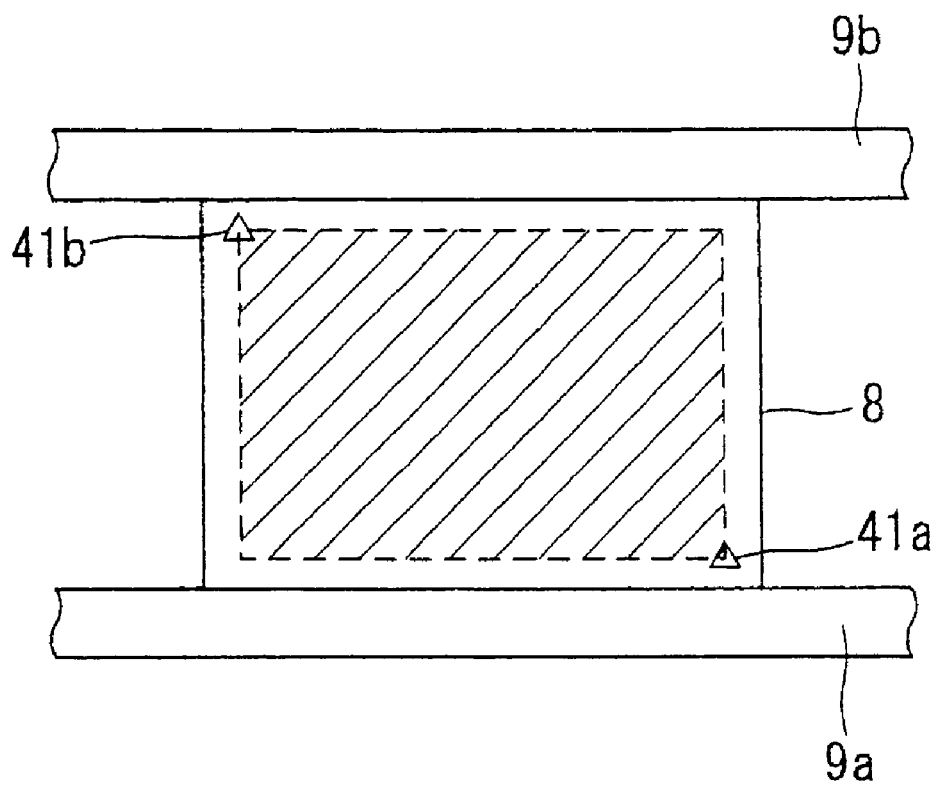
FIG. 11 is an explanatory view of a component mounting region.
Figure 12:
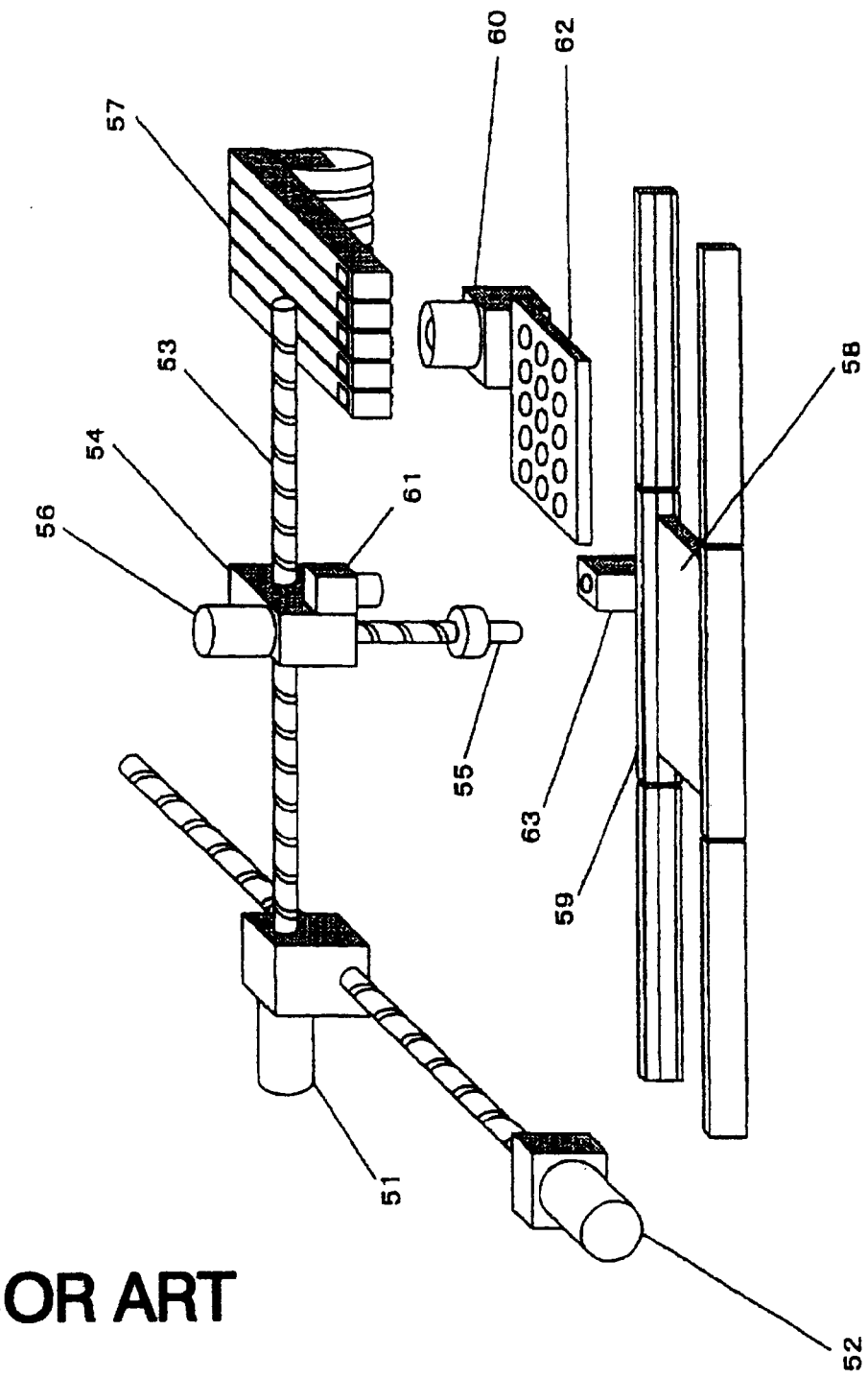
FIG. 12 is a perspective view showing the background art.
Figure 13:
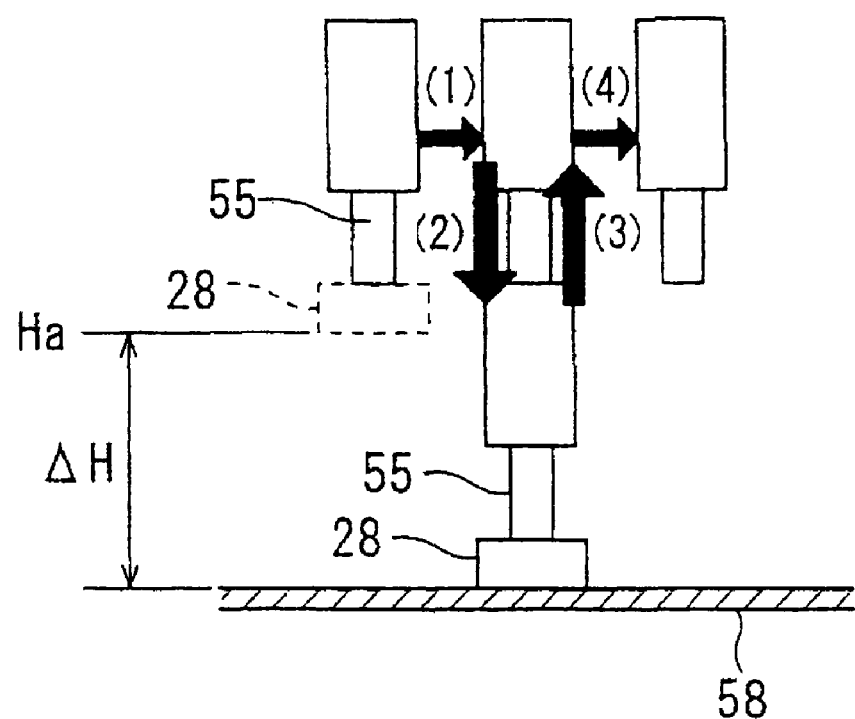
FIG. 13 is a perspective view showing a moving trajectory of a nozzle in the background art.

As shown in FIG. 11, an internal region with respect to a pair of board marks 41a and 41b provided on end portion sides of the board 8 can be used as the component mounting region. It will be sufficient if two board marks 41a and 41b are disposed on a diagonal line of the component mounting region as shown in FIG. 11. Incidentally, board marks may be recognized so that the component mounting region can be calculated based on the recognized board marks and in predetermined conditions, or any other indicator than the board marks may be used to set the component mounting region. Further, a conveyance rail movable in accordance with a width of the board to be conveyed and a position detection means for detecting the position of the conveyance rail may be provided so that the component mounting region can be calculated from information of the position of the conveyance rail detected by the position detection means.

For setting the component mounting region, the following points are included in the setting conditions.
1) An interval between the fixed conveyance rail side and the movable conveyance rail side is adjusted in accordance with the size of the intended board so as to be not smaller than 50 mm. Since no conveyance rail is present in the internal region of this interval, the component mounting region is set between these conveyance rails.
2) The component mounting region is set after the computer unit 14 has confirmed that the component held by the nozzle does not interfere with any conveyance rail when the component is virtually (arithmetically) rotated by 360°.

Based on the above description, as a preferred manner for calculating the component mounting region, it is possible to use the following methods. That is,
a method of calculating the component mounting region by recognizing the board marks (the board marks have to be always recognized for calculating a board position prior to start of mounting).
a method of calculating the component mounting region from information of the positions of the conveyance rails when the conveyance rails are of the automatic width adjustment system.

Incidentally, it is possible to obtain the size of the board from the aforementioned NC program so that it is possible to calculate the component mounting region from the information. It is not clear whether a board just as defined in the NC program is supplied or not. Therefore, it is preferable to use the more reliable method in which the component mounting region is calculated based on the recognized board marks or calculated from the information of the positions of the conveyance rails.

As described above, in the component mounting region, the nozzle 5 moves at the component mounting region movement height H1 and the component 28 is mounted by the nozzle 5 moved down from the component mounting region movement height H1. Accordingly, it is possible to shorten an elevating stroke of the nozzle 5. As a result, time required for the mounting can be shortened so that the production efficiency can be improved.

In addition, the descending operation of the nozzle 5 at the time of the mounting is performed in an arc trajectory so that a substantial movement path length of the nozzle 5 can be shortened and mounting speed can be increased. Thus, production efficiency can be improved.

Although the present invention has been described in detail and with reference to its specific embodiments, it is obvious to those skilled in the art that various changes or modifications can be made without departing from the spirit and scope of the present invention.

The present application is based on Japanese Patent Application No. 2003-116868 filed on Apr. 22, 2003 and Japanese Patent Application No. 2003-303065 filed on Aug. 27, 2003, the contents of which are incorporated herein by reference.

Industrial Applicability

According to the preset invention, an elevating stroke of the nozzle at the time of mounting a component in the component mounting apparatus can be shortened so that time required for elevating the nozzle can be saved. It is therefore possible to provide a component mounting apparatus and a component mounting method with higher production efficiency than that according to the background art. Further, the nozzle can be moved and elevated in an arc trajectory so that time required for elevating the nozzle can be shortened more greatly. It is therefore possible to provide a component mounting apparatus and a component mounting method with higher production efficiency than that according to the background art.

The invention claimed is:

1. A component mounting method comprising the steps of;
using a nozzle to hold a component at a lower end of the nozzle, said component being supplied from a component supply unit;
moving said nozzle up and down and horizontally based on information about positions and heights of obstacles located between said component supply unit and a board; and
mounting said component on said board;
wherein said moving step comprising;
finding a highest one of said obstacles located between a current position of said nozzle and a position of said board;
moving up said nozzle to a height high enough not to interfere with said highest obstacle;
moving said nozzle horizontally toward said board;
determining said nozzle having passed over said highest obstacle;
comparing a current height of said nozzle with heights of upcoming obstacles located between said highest obstacle and said board; and
moving down said nozzle to a height high enough not to interfere with said upcoming obstacles in sync with the time when said nozzle has finished passing over said highest obstacle.

2. A component mounting method according to claim 1, wherein a horizontal movement operation and an elevating operation are performed simultaneously so as to move said nozzle in an arc moving trajectory when said component is to be mounted on said board.

3. A component mounting method according to claim 1, wherein said moving step further comprises locating said nozzle at a height high enough not to interfere with a first one of said obstacles and then moving said nozzle to a height high enough not to interfere with a next one of said obstacles in sync with the time when said nozzle has finished passing over said first one of said obstacles.

* * * * *